(12) United States Patent
Choi et al.

(10) Patent No.: US 7,868,958 B2
(45) Date of Patent: Jan. 11, 2011

(54) MANUFACTURING LIQUID CRYSTAL DISPLAY WITH INCREMENTAL REMOVAL OF AN INSULATING LAYER

(75) Inventors: Seung-Ha Choi, Siheung-si (KR); Min-Seok Oh, Yongin-si (KR); Sang-Gab Kim, Seoul (KR); Jae-Ho Choi, Seoul (KR); Yu-Gwang Jeong, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 605 days.

(21) Appl. No.: 11/897,769

(22) Filed: Aug. 31, 2007

(65) Prior Publication Data

US 2008/0106685 A1    May 8, 2008

(30) Foreign Application Priority Data

Sep. 5, 2006    (KR) .................. 10-2006-0085089

(51) Int. Cl.
    *G02F 1/136*    (2006.01)
(52) U.S. Cl. .................. 349/43; 349/42; 257/59; 257/72; 345/92
(58) Field of Classification Search .......... 349/42, 349/43; 257/59, 72; 345/92
    See application file for complete search history.

(56) References Cited

U.S. PATENT DOCUMENTS

| 5,483,082 A * | 1/1996 | Takizawa et al. .......... 257/59 |
| 5,555,112 A * | 9/1996 | Oritsuki et al. .......... 349/46 |
| 2005/0077521 A1 | 4/2005 | Yoo et al. |
| 2005/0112790 A1 | 5/2005 | Lan et al. |
| 2005/0142681 A1 | 6/2005 | Soh |
| 2005/0142714 A1 | 6/2005 | Chae et al. |
| 2006/0141710 A1 * | 6/2006 | Yoon et al. .......... 438/261 |
| 2006/0186411 A1 | 8/2006 | Kim et al. |
| 2007/0058097 A1 * | 3/2007 | Kato et al. .......... 349/38 |

FOREIGN PATENT DOCUMENTS

| CN | 1637593 | 7/2005 |
| JP | 2001-133804 | 5/2001 |
| JP | 2004-38130 | 2/2004 |
| JP | 2004-212933 | 7/2004 |
| JP | 2004-334214 | 11/2004 |

(Continued)

OTHER PUBLICATIONS

Patent Abstracts of Japan, Publication No. 2001-133804, May 18, 2001, 1 p.

(Continued)

*Primary Examiner*—Julie-Huyen L Ngo
(74) *Attorney, Agent, or Firm*—Innovation Counsel LLP

(57) ABSTRACT

A method for forming a liquid crystal display device includes incremental removal of a gate insulator. After forming a gate line layer, a gate insulator, a semiconductor layer, a data layer and a photoresist layer, a mask is used to define a plurality of regions in the photoresist layer through selective development. The developed portions of the photoresist layer are removed and parts of the underlying layers are etched in a plurality of steps using the photoresist layer as a mask. The gate insulator is partially removed during the etching of the data layer and completely removed during formation of source and drain electrodes.

10 Claims, 22 Drawing Sheets

FOREIGN PATENT DOCUMENTS

| | | |
|---|---|---|
| JP | 2006-18281 | 1/2006 |
| KR | 10-0476366 | 3/2005 |
| KR | 10-2005-0068214 | 7/2005 |
| KR | 10-2005-0068979 | 7/2005 |
| KR | 10-2005-0105422 | 11/2005 |
| KR | 10-2005-0122654 | 12/2005 |
| KR | 10-2006-0023716 | 3/2006 |

OTHER PUBLICATIONS

Patent Abstracts of Japan, Publication No. 2004-038130, Feb. 5, 2004, 1 p.

Patent Abstracts of Japan, Publication No. 2004-212933, Jul. 29, 2004, 1 p.

Patent Abstracts of Japan, Publication No. 2004-334214, Nov. 25, 2004, 1 p.

Patent Abstracts of Japan, Publication No. 2006-018281, Jan. 19, 2006, 1 p.

Korean Patent Abstracts, Publication No. 100476366, Mar. 3, 2005, 1 p.

Korean Patent Abstracts, Publication No. 1020050068214, Jul. 5, 2005, 1 p.

Korean Patent Abstracts, Publication No. 1020050068979, Jul. 5, 2005, 1 p.

Korean Patent Abstracts, Publication No. 1020050105422, Nov. 4, 2005, 1 p.

Korean Patent Abstracts, Publication No. 1020050122654, Dec. 29, 2005, 1 p.

Korean Patent Abstracts, Publication No. 1020060023716, Mar. 15, 2006, 1 p.

* cited by examiner

MANUFACTURING LIQUID CRYSTAL DISPLAY WITH INCREMENTAL REMOVAL OF AN INSULATING LAYER

CROSS-REFERENCE TO RELATED APPLICATION

This application claims the priority of Korean Patent Application No. 10-2006-085089 filed on Sep. 5, 2006 in the Korean Intellectual Property Office. The entire disclosure of this priority application is incorporated herein by reference.

BACKGROUND OF THE INVENTION

1. Field of the Invention

The present invention relates to a liquid crystal display (LCD) device, and more particularly, to a method for forming a data line and a data line pattern in an LCD device while increasing device reliability.

2. Description of the Related Art

Thin film transistors (TFTs) are widely used as switching elements for pixels in a flat panel display device such as a liquid crystal display device or an organic light emitting display device. Liquid crystal display devices include a plurality of pixels, and each pixel includes a gate line to pass a gate signal (injection signal), a data line to pass a data signal, and a thin film transistor.

The thin film transistor includes a gate electrode coupled to the gate line, a source electrode coupled to the data line, and a drain electrode coupled to a pixel electrode of the pixel. These electrodes are formed over a semiconductor layer. The thin film transistor functions to transfer a data signal from the data line to the pixel electrode in response to a gate (injection) signal from the gate line.

In order to connect the pixel electrode with the drain electrode which is separated from each other with a passivation layer or passivation layer, a contact hole is made in the passivation layer, which is typically made of an inorganic matter, positioned over the thin film transistor.

During the manufacturing process of liquid crystal display device, a passivation layer is deposited over the data pad and drain electrode. However, the gate pad is covered not only by the passivation layer but also by the gate insulator.

Then, an etching process is applied to the photoresist layer. At this time, since the gate insulator as well as the passivation layer is over the gate pad, the passivation layer over the gate pad is first developed with the passivation layer over the data pad and the data electrode. Then, the etching process is applied to the gate pad to etch the gate insulator. During the process, the data pad and drain electrode are exposed to the etching process, so that the surface of the data pad and drain electrode is damaged.

Also, a contact hole over the data pad and drain electrode forms a reverse type taper structure, which is the structure as the higher up, the narrower in a cross-sectional area, so that the transparent pixel electrode may not connect well enough to the data pad and the drain electrode. Also, the etching process damages the surface of the data pad and drain electrode, which increases the contact resistance between the pixel electrode and the data pad or drain electrode. Therefore, the reliability and electrical characteristics of the liquid crystal display device are degraded.

SUMMARY OF THE INVENTION

The present invention provides a manufacturing method for which achieves improved the electrical characteristic and reliability of the LCD display.

In order to achieve this invention, the manufacturing method comprises: forming a gate line on an insulating substrate; forming a gate insulating layer on the gate line; sequentially forming a semiconductor layer, and a data layer on the gate insulating layer; forming a photosensitive film to a thickness on the data layer; forming a first photosensitive film pattern by exposing the photosensitive film to light using a mask to selectively develop predetermined portions of the photosensitive film, the mask being configured such that a plurality of regions are defined in the photosensitive film with certain ones of the plurality of regions having developed and undeveloped thickness, wherein in a first region the photosensitive film has a first undeveloped thickness, in a second region the photosensitive film has a second undeveloped thickness, in a third region the photosensitive film has a third undeveloped thickness which is less than the second undeveloped thickness, and in a fourth region the photosensitive film is developed to a thickness equal to the thickness of the photosensitive film; removing the developed portions of the photosensitive film; etching the data layer, the semiconductor layer, and the gate insulating layer under the fourth region using the first photosensitive pattern; forming a second photosensitive pattern by ashing the first photosensitive film pattern to thereby expose the data layer under the third region; forming a semiconductor pattern and a data line including a preliminary source drain pattern and an end part by etching the data layer and the semiconductor layer using the second photosensitive film pattern; forming a third photosensitive film pattern by ashing the second photosensitive film pattern to thereby expose the preliminary source drain pattern under the second region; forming source and drain electrodes by etching the exposed preliminary source drain pattern using the third photosensitive film pattern; and removing the third photosensitive film pattern.

After this process, an passivation layer is formed over the all layers including the gate pad of the gate line, a data pad and the drain electrode of the data line; and a second contact hole is formed in the passivation layer to expose the gate pad, data pad, and the drain electrode, in which the second contact hole is wider than the first contact hole.

In one embodiment of the present invention, the manufacturing method uses a mask including a light protection region, a light transmission region, a half light transmission region, and a slit region. The light protection region of the mask defines a first region, the slit region defines a second region, the half light transmission region defines a third region, and the light transmission region defines a fourth region.

As a result, it is possible to protect for a contact hole in the passivation layer to have a reverse type taper structure. Also, during the etching process for exposing the data pad, the gate pad can be protected from over etching.

DETAILED DESCRIPTION OF THE EMBODIMENTS

Figure 1:
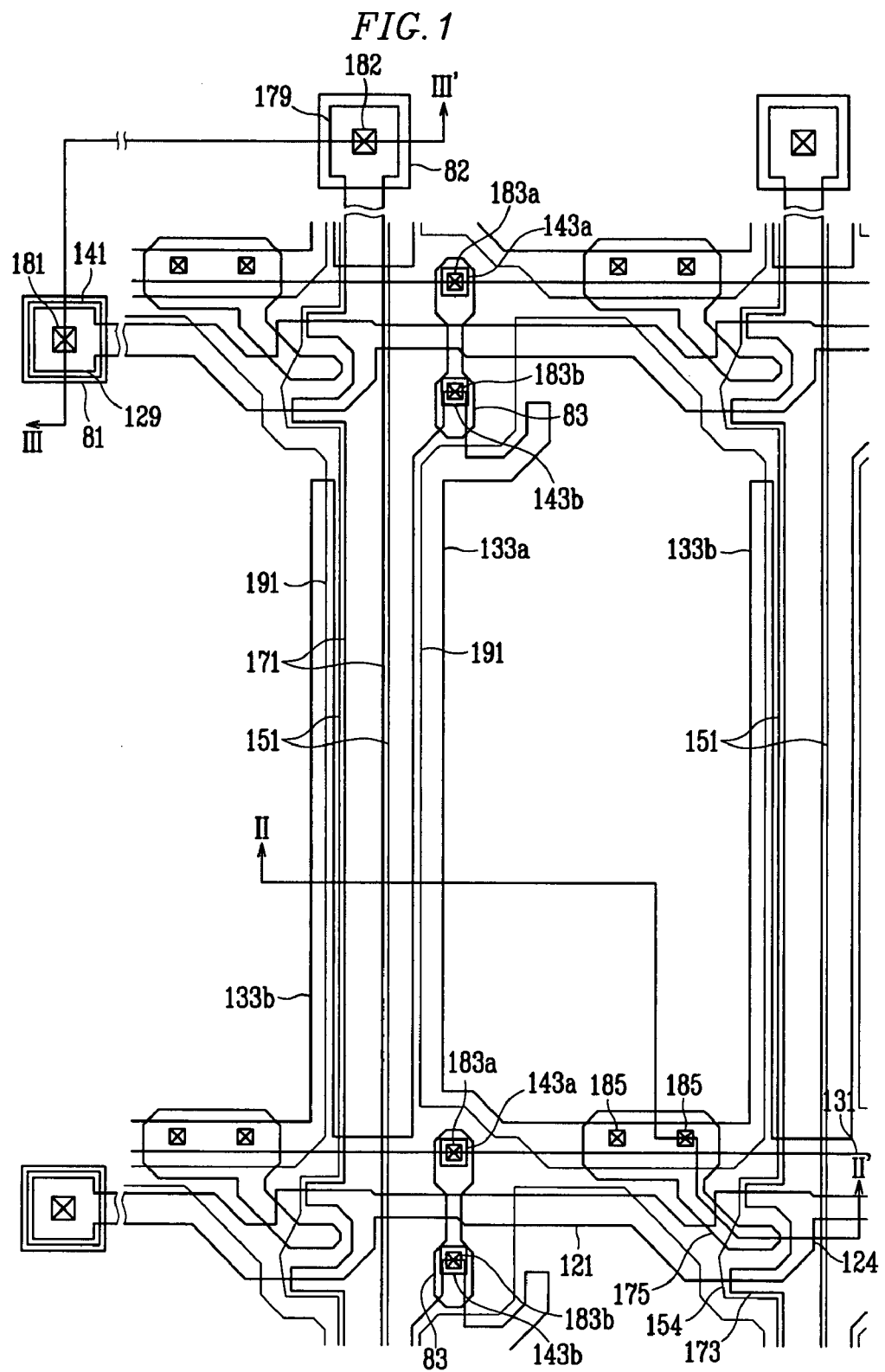
FIG. 1 is a plan view showing a pixel of a liquid crystal display device according to one embodiment of this invention.
Figure 2:
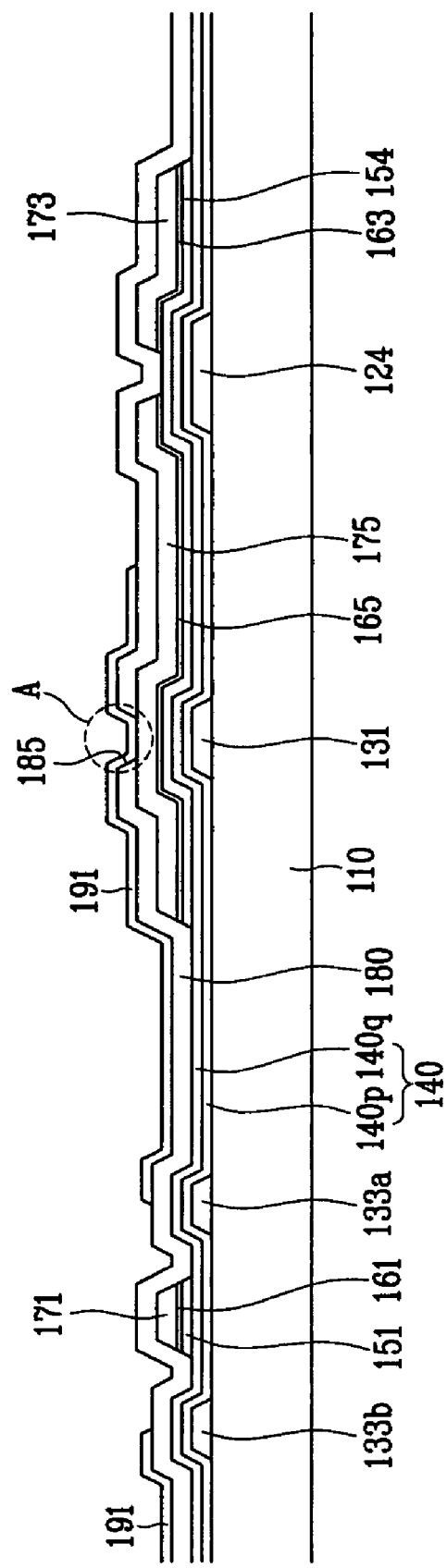
FIG. 2 is a cross-sectional view taken along line II-II' of FIG. 1.
Figure 3:
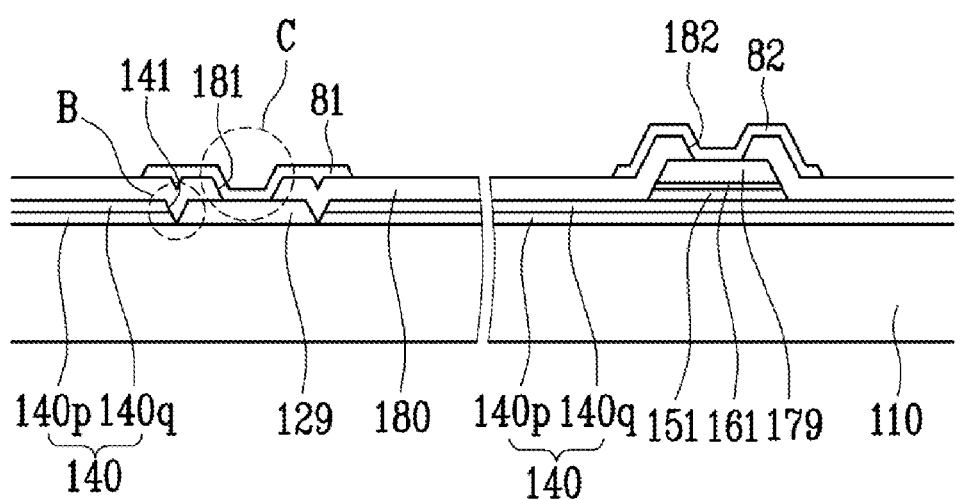
FIG. 3 is a cross-sectional view taken along line III-III' of FIG. 1.

Some embodiments of the present invention are described below with reference FIG. 1 to FIG. 22. FIG. 1 is a plan view showing a pixel of a liquid crystal display according to one embodiment of this invention. FIG. 2 is a cross-sectional view taken along line II-II' of FIG. 1. FIG. 3 is a cross-sectional view taken along line III-III' of FIG. 1.

Referring to FIG. 1 to FIG. 3, a plurality of gate lines 121 and storage electrode lines 131 are formed on a insulation substrate 110.

Each gate line 121 extends in a row direction and provides a gate signal. The gate line 121 includes a gate electrode 124 and a gate pad 129. The gate electrode 124 is a portion formed in a pixel as a protrusion shape, and the gate pad 129 is a portion formed in a peripheral of the pixel to connect to other circuits.

A gate drive circuit (not shown) may be formed on a flexible printed circuit film or may be directly formed on the lower substrate 110. When the gate drive circuit is directly formed on the lower substrate 110, the gate line 121 receives a gate signal directly from the gate drive circuit.

In the case of storage line, the storage line 131 runs parallel to the gate line 121 receives a certain level of voltage, and includes storage electrodes 133a, 133b extending from the storage line. The storage line 131 is formed between two consecutive gate lines 121. One end portion, a fixed portion, of the each storage electrode 133a and 133b is connected to the storage line 131. The other end portion is freely formed without connection. The first storage electrode 133a is narrower width-wise than the second storage electrode 133b. A shape and arrangement of the storage electrodes can be formed in various shapes. The gate line 121 and the storage electrode line 131 may be formed of aluminum (Al) or an aluminum alloy, silver (Ag) or a silver alloy, copper (Cu) or a copper alloy, molybdenum (Mo) or a molybdenum alloy, chrome (Cr), tantalum (Ta) or titanium (Ti).

The gate line 121 can be formed by multi-layer structure having at least two different physical characteristics. In order to reduce signal delay or voltage drop, one of the layers may be formed of low resistance material, such as aluminum, silver or copper.

The other layer is formed of another material such as molybdenum, chrome, titanium, or tantalum having excellent physical, chemical, electrical quality to contact with indium tin oxide (ITO) or indium zinc oxide (IZO).

One example of this combination is forming chrome as the lower metal layer, and aluminum alloy as the upper metal layer, or aluminum alloy as the lower metal layer and a molybdenum alloy as the upper metal.

However, the gate line 121, the gate pad 124 and a storage line 131 can be formed using various metals and electric conductors.

The lateral face of the gate line 121, the gate pad 124 and the storage line 131 is inclined to the lower substrate 110, and it is desirable that the tilt angle as measured from the adjacent surface at the substrate be about 30° or about 80°.

Generally, over the gate line 121, the gate pad 124 and the storage line 131, a gate insulator 140 is formed of silicon nitride (SiNx) or silicon oxide (SiOx).

This gate insulator 140 includes a lower film 140p and upper film 140q. When the lower film 140p has a thickness of about 4,000 Å, the upper gate film 140q has a thickness of about 500 Å.

The gate insulator 140 includes a plurality of contact holes 141, 143a, and 143b, in which the contact hole 141 is for exposing the gate pad 129 of gate line 121, the contact hole 143a for exposing one part of a storage line 131, the contact hole 143b for exposing the end portion of the first storage electrode 133a.

Over the gate insulator 140, a semiconductor layer 151 is formed of poly-silicon. The poly-silicon semiconductor 151 generally extends in a column direction and includes a protrusion portion 154.

Ohmic contact layers 161, 165 which are linear and island types are gradually formed over the semiconductor layer 151.

The ohmic contact layers 161, 163 and 165 are made of amorphous silicon, which is doped by n-type phosphorus or p-type boron, polycrystalline silicon or silicide silicon. The ohmic contact layer 163 and 165 are formed over the protrusion portion 154 of the semiconductor layer 165.

The lateral shape of semiconductor layers 151, 154 and ohmic contact layers 161, 163, 165 are inclined to the lower substrate 110 by about 30° or 80°.

Over the ohmic contact layers 161, 165 and gate insulation layer 140, a drain electrode 175 and a data line 171 are formed.

The data line 171 provides a data signal and traverses the gate line.

Each data line 171 traverses the storage line 131 and is formed between the first storage electrode 133a in a current pixel and a storage electrode 133b in an adjacent pixel.

The data line 171 includes a source electrode 173 and a data pad 179, in which the source electrode 173 extends to the gate electrode 124 and the data pad 179 is widen to connect with other circuitries.

A data drive circuit which generates data signals is formed on a flexible printed circuit film attached on the lower substrate 110. The data driver circuit may be formed in the lower substrate 110 so as to directly connect to the data line 171.

Drain electrode 175 is formed apart from the data line 171 and is faced to a source electrode 173 over the gate electrode 124.

Each drain electrode 175 has a first end point which is a widen area type and a second end point which is a bar type. One part of the second end part is surrounded by the source electrode 173.

With a gate electrode 124, a source electrode 173 and a drain electrode 175, a thin film transistor thin film transistor TFT is accomplished with a projecting part 154 of the semiconductor layer 151, and the channel of the thin film transistor is formed on the projecting part 154 positioned between the source electrode 173 and the drain electrode 175.

The data line 171 and the drain electrode 175 are desirable to be formed of a refractory metal or its alloy such as molybdenum, chrome, tantalum or titanium, and may have a multi-layer structure including a refractory metal and a low resistance conductive material.

The multi-layer structure may be two layers or triple layers. The two layers are made of a lower film and an upper film, in which the lower film may be chrome (alloy) or molybdenum (alloy) and the upper film may be aluminum (alloy). The triple layers are made of triple films, for example molybdenum (alloy) as a lower film, aluminum (alloy) as an intermediate film and molybdenum (alloy) as an upper film. The data line 171 and the drain electrode 175, however, can be formed of various metal or electric conductors.

Each side of the data conductors 171, 175 is desirable to have a tilt angle about 30° or 80° for the lower substrate 110.

Ohmic contact layers 161, 165 exist over the semiconductor layer 151 and under the data line 171 and the drain electrode 175 to reduce contact resistance.

The semiconductor layer 151 includes exposed portions which are not covered by the source electrode 173, the drain electrode 175 and the data line 171.

Over the exposed portion, data line 171 and the drain electrode 175, a passivation layer 180 is formed.

As the width of the semiconductor layer 151 is wider than that of the data line 171 in a portion that the gate line 121 is formed so that a profile of the surface becomes smooth, the data line 171 is protected from disconnection.

The passivation layer 180 is formed of inorganic insulating material, such as silicon nitride (SiNx) or silicon oxide (SiOx).

On the other hand, the passivation layer 180 may be a combination of a lower passivation layer and upper passivation layer (not shown), in which the lower passivation layer is formed by organic insulating material or inorganic insulating material and also the upper passivation layer is formed by organic insulating material. The organic insulating material may be photosensitive material having a dielectric constant under 4.0.

The passivation layer 180 also includes a contact hole 181 to expose a gate pad 129 of the gate line 121, a contact hole 182 to expose a data pad 170 of the data line 171, a contact hole 185 to expose a drain electrode, a contact hole 183a to expose one part of the storage line 131 near a storage electrode 183a and a contact hole 183b to expose a storage electrode 183b.

A cross sectional area of the contact holes 181, 182, 183a, 183b and 185 becomes wide from bottom to top area. Namely, lateral sides of the contact holes 181, 182, 183a, 183b and 185 have a taper structure as shown in A of FIG. 2 and C of FIG. 3.

The contact hole 181 to expose the gate pad, a contact hole 183a to expose a fixed portion of the first storage electrode 133a, and a contact hole 183b to expose the free end of the first storage electrode 133a are formed in inner portion of the contact holes 141, 143a and 143b of gate insulator 140, respectively. Lateral sides of the contact holes 141, 143a and 143b have a taper structure.

Over the passivation layer 180, a plurality of pixel electrodes 191, a plurality of connecting legs 83 and a plurality of contact assistants 81, 82 are formed of transparent material such as ITO, IZO, or reflective metal such as aluminum (alloy), silver (alloy), or chrome (alloy).

In order not to disconnect the data line, a taper structure of is applied to the contact holes 181, 182 and 185 in which a pixel electrode 191, connecting leg 83 and contact assistants 81, 82 are formed.

The pixel electrode 191 is electrically and physically coupled to the drain electrode 175 via a contact hole 185, and also receives a data voltage from the drain electrode 175.

Orientation of liquid crystal molecules is determined by the electric field which is applied between a pixel electrode 191 which receives a data voltage and a common electrode which receives a common voltage.

According to the orientation of liquid crystal molecule, the polarized light passing through the liquid crystal layer is varied.

A liquid crystal capacitor formed between the pixel electrode 191 and common electrode maintains a supplied voltage even after a thin film transistor is turned off.

The pixel electrode 191 is overlapped with the storage electrodes 133a, 133b and the storage line 131.

A storage capacitor is formed between the pixel electrode 191 connected to the drain electrode 171 and the storage line 131, and also enforces the voltage holding ability of liquid crystal capacitor.

Contact assistants 81, 82 are coupled to the gate pad 129 of the gate line 121, and the data pad 179 of the data line 171, respectively, via contact holes 181, 182, respectively, to permit contact with external devices.

Through the connection leg 83 crossing the gate line 121, the storage line 131 is linked to the free end of the first storage electrode 133a via contact holes 183a, 183b.

The storage electrodes 133a, 133b and the storage line 131 may be used to fix a defect of the gate line 121, data line 171 or thin film transistor but also the storage line 131.

A manufacturing method of a liquid crystal display device for FIG. 1 to FIG. 3 is shown in FIG. 4 to FIG. 22.

Figure 4:
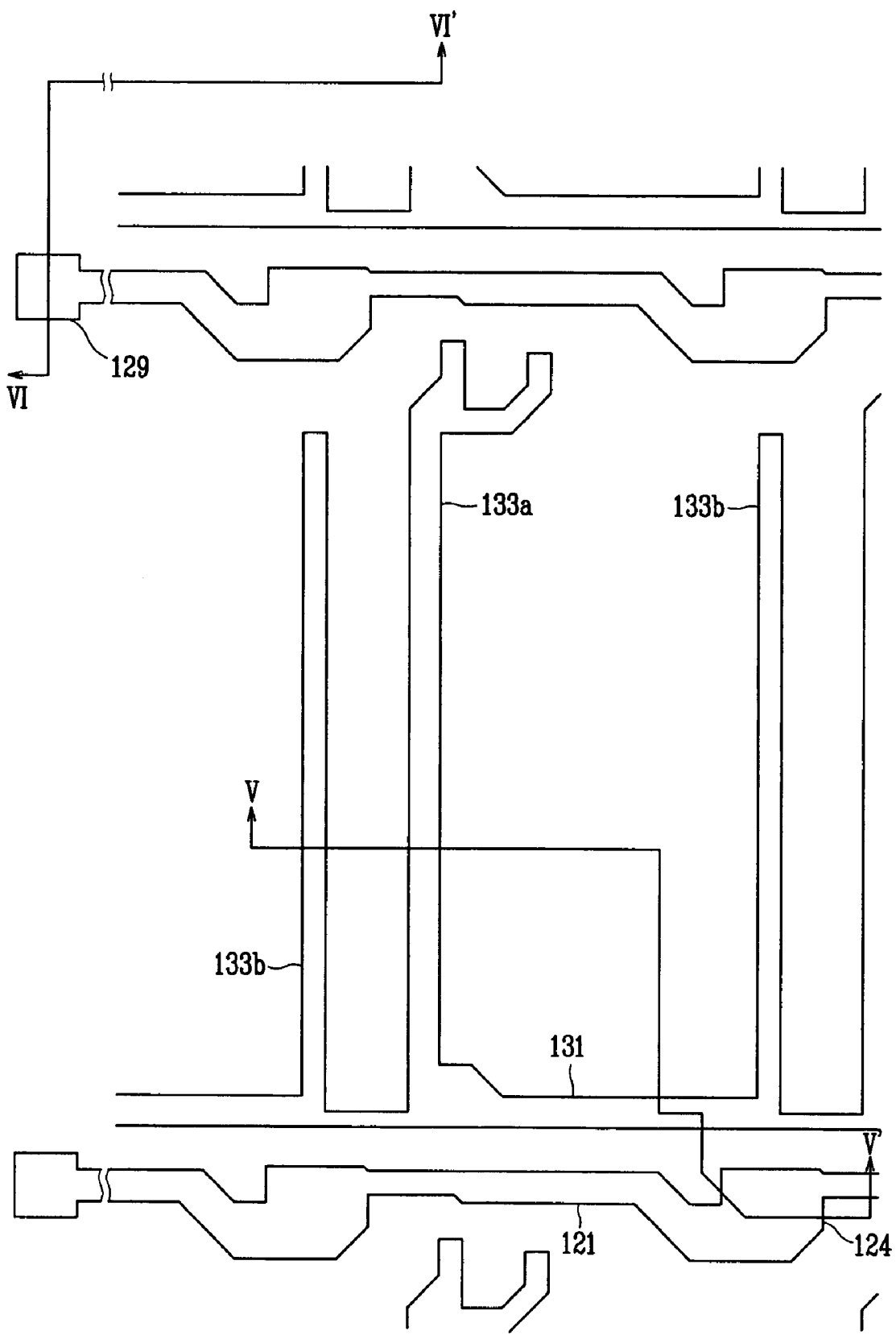
FIG. 4 is a plan view illustrating a forming process of a gate line and a storage line of a liquid crystal display panel.
Figure 5:
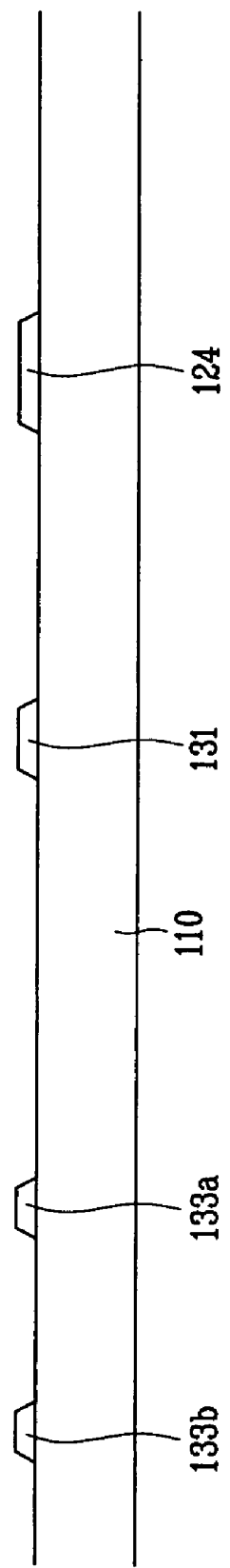
FIG. 5 is a cross-sectional view taken along line V-V' of FIG. 4.
Figure 6:
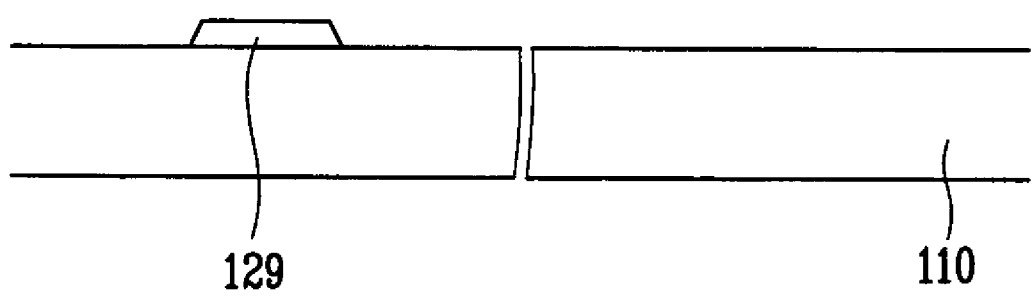
FIG. 6 is a cross-sectional view taken along line VI-VI' of FIG. 4.
Figure 16:
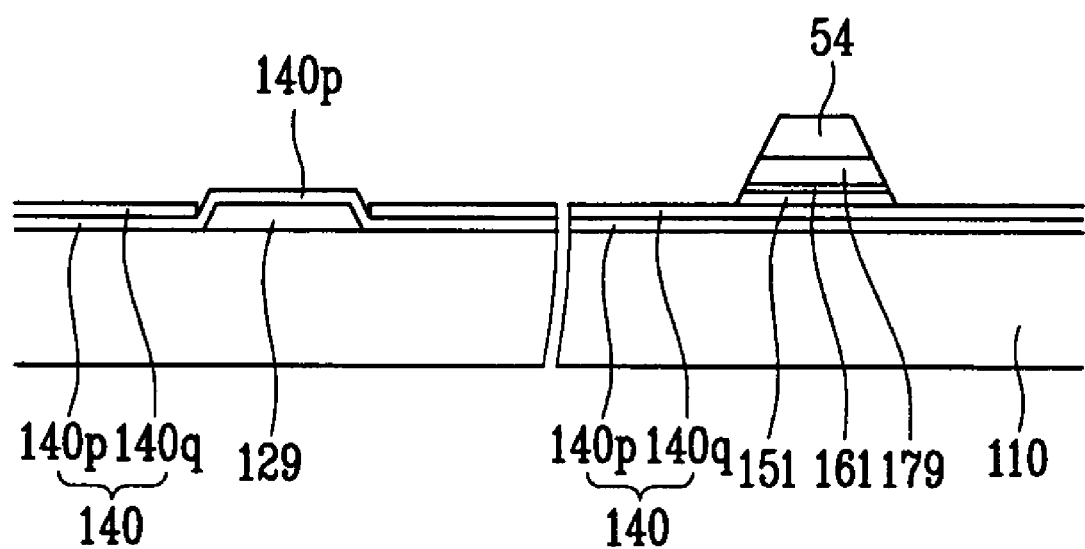
Figure 17:
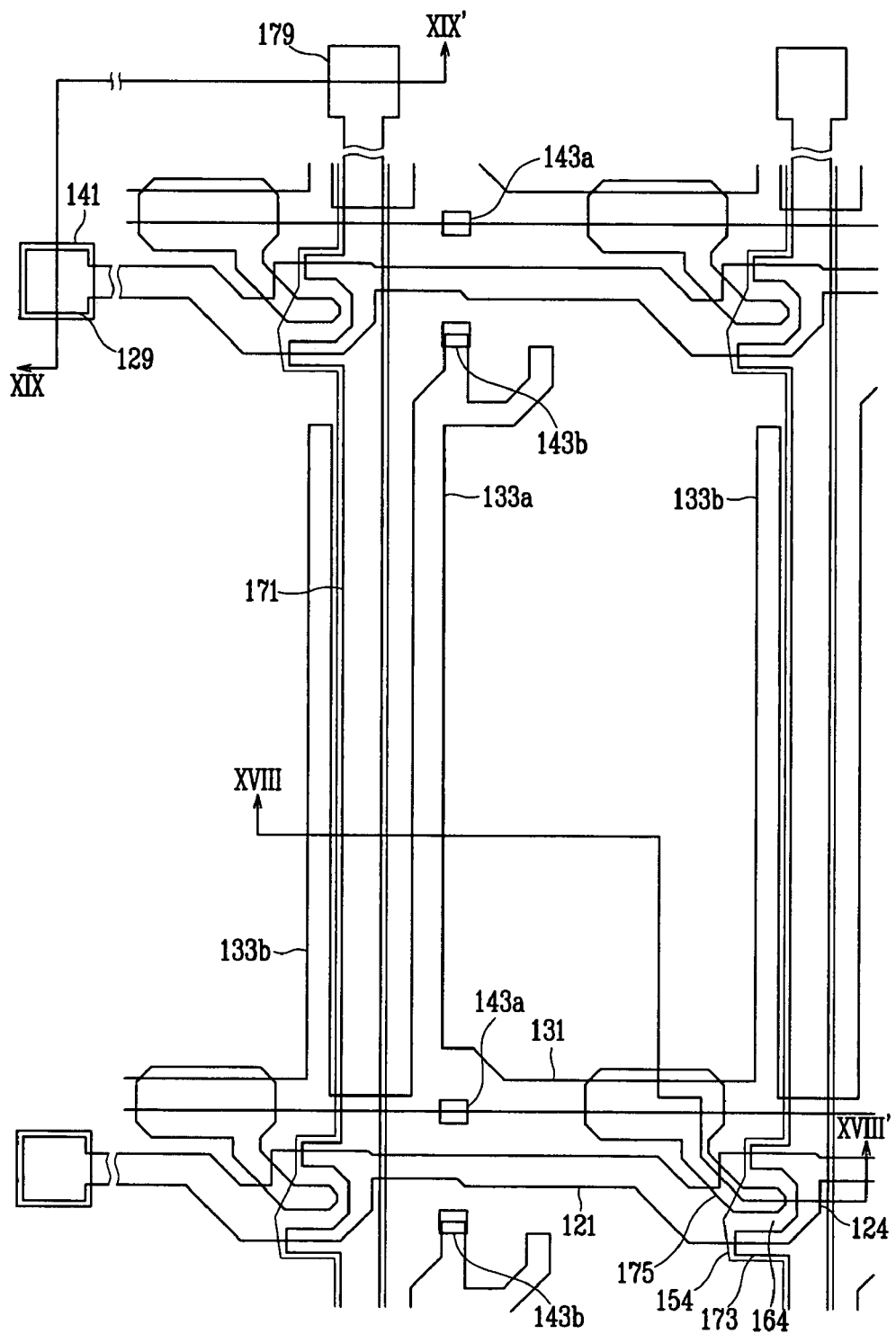
FIG. 17 is a plan view illustrating a forming process of a data line of a liquid crystal display panel.
Figure 18:
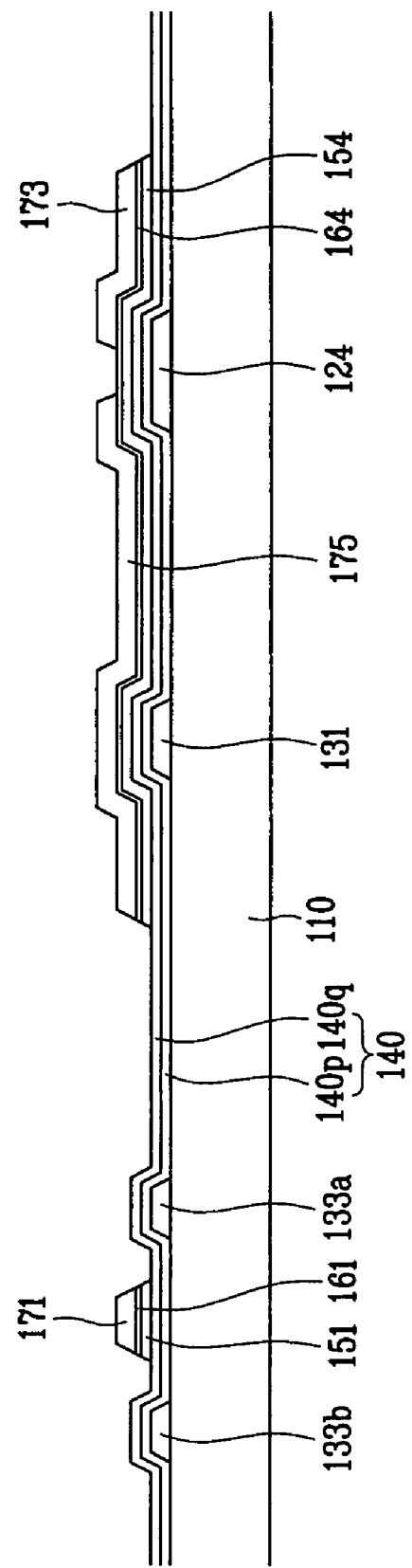
FIG. 18 is a cross-sectional view taken along line XVIII-XVIII' of FIG. 17.
Figure 19:
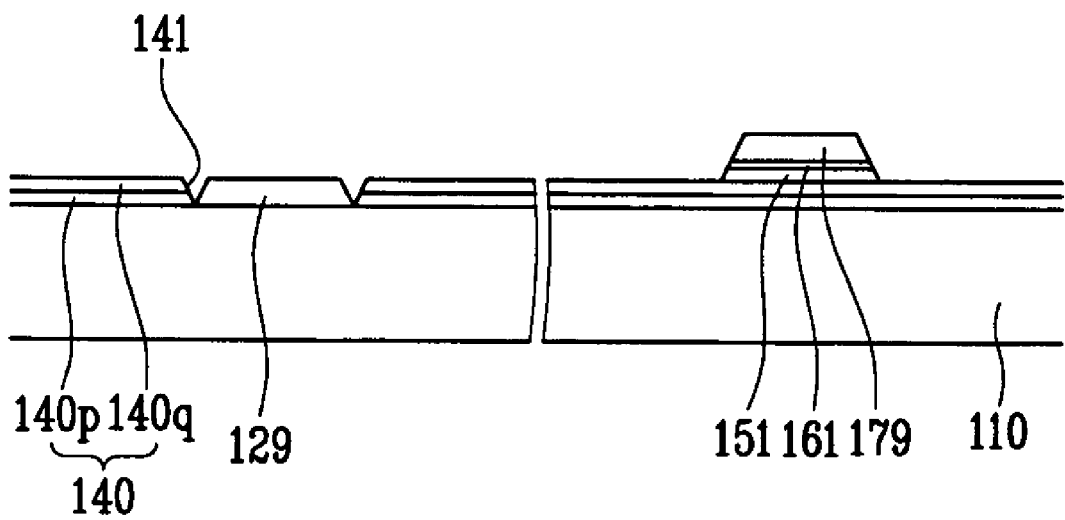
FIG. 19 is a cross-sectional view taken along line XIX-XIX' of FIG. 17.
Figure 20:
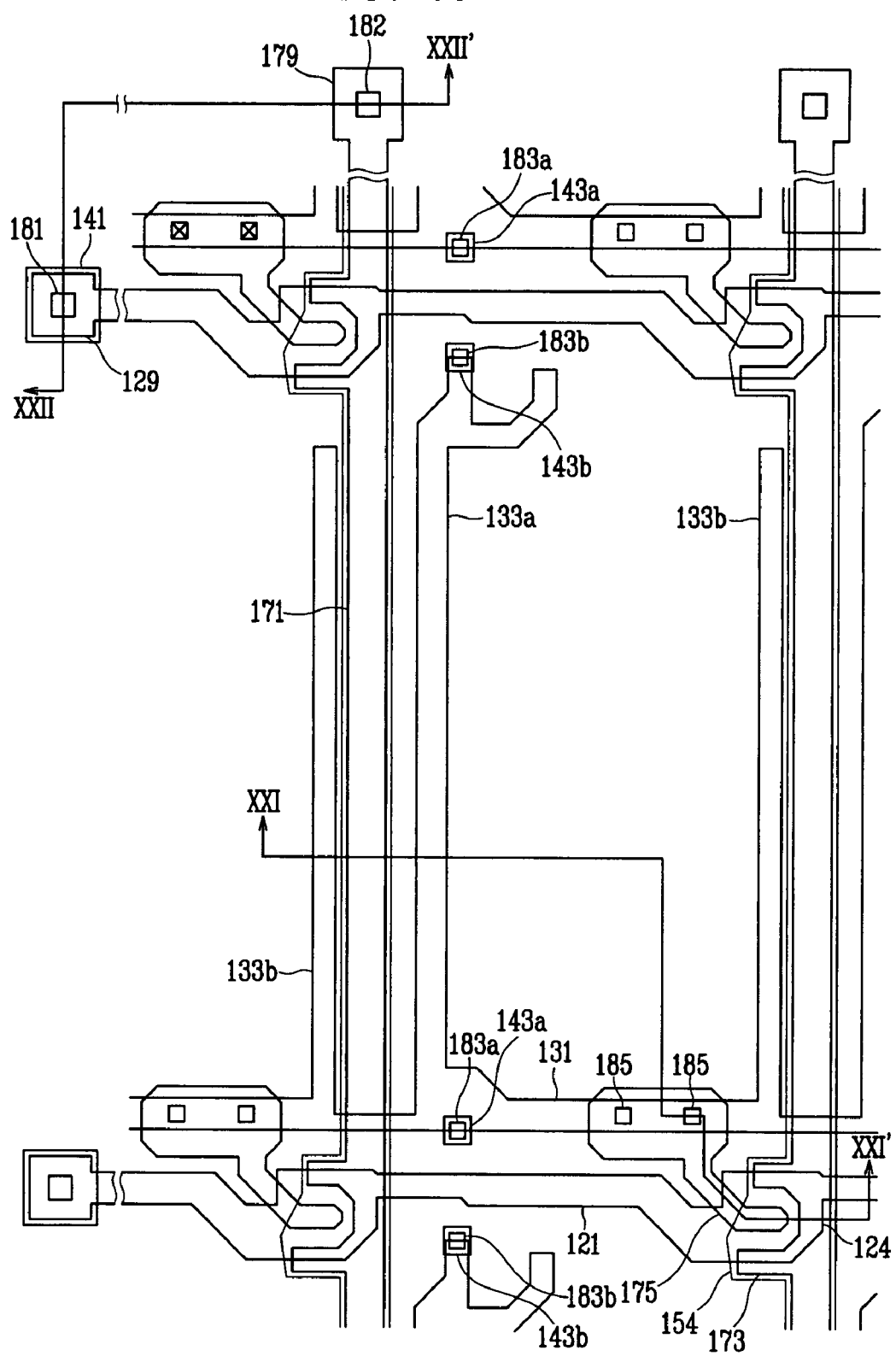
FIG. 20 is a plane view illustrating a forming process of a passivation layer of a liquid crystal display panel.

FIG. 4, FIG. 17 and FIG. 20 are plane views useful for showing a manufacturing process of a liquid crystal display panel. FIG. 5 and FIG. 6 are cross-sectional views taken along line V-V', and VI-VI' of FIG. 4. FIG. 7, FIG. 9, FIG. 11, FIG. 13 and FIG. 15 are cross-sectional views illustrating a forming process over a gate line and a storage line of FIG. 5. FIGS. 8, 10, 12, 14 and 16 are cross-sectional views illustrating a forming process over a data line of FIG. 6. FIG. 18 and FIG. 19 are cross-sectional views taken along line XVIII-XVIII', and XIX-XIX' of FIG. 17.

Figure 21:
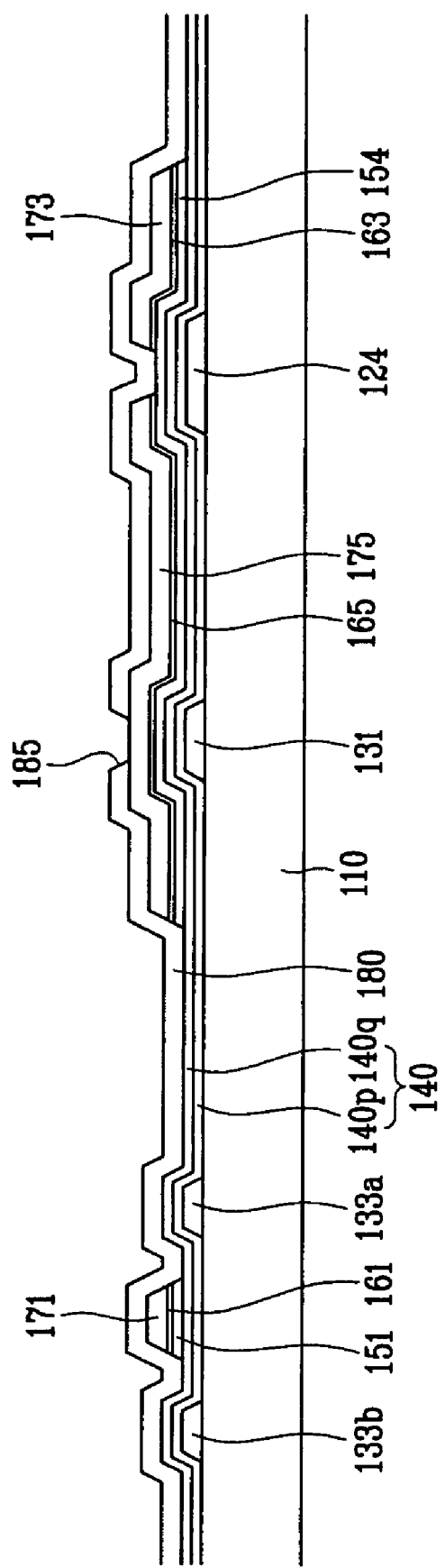
FIG. 21 is a cross-sectional view taken along line XXI-XXI' of FIG. 17.
Figure 22:
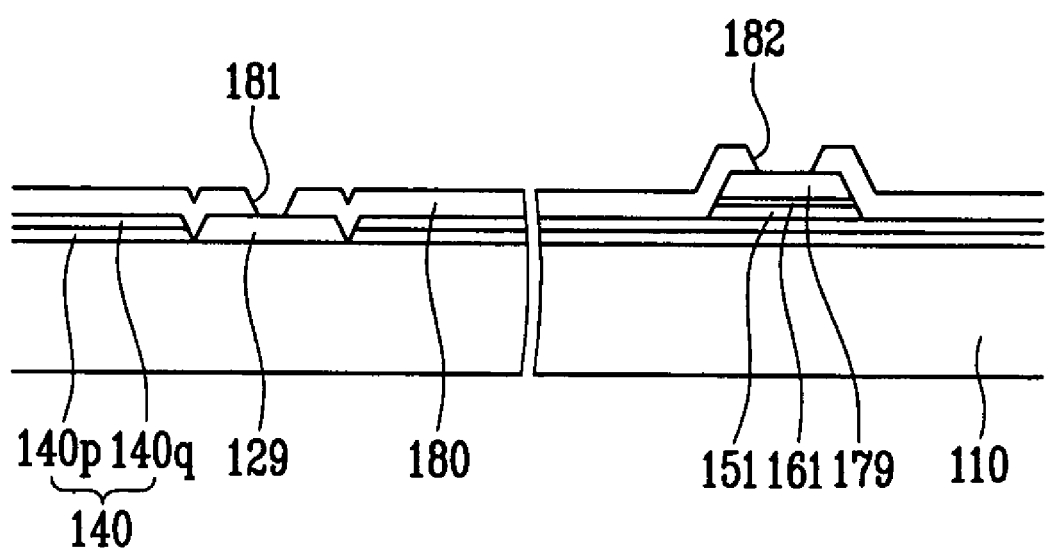
FIG. 22 is a cross-sectional view taken along line XXII-XXII' of FIG. 17.

FIG. 21 and FIG. 22 are a cross-sectional view taken along line XXI-XXI', and XXII-XXII' of FIG. 20.

Referring to FIG. 4 to FIG. 6, a metal layer is deposited by sputtering process on the lower substrate 110 formed of glass or plastic, and then an etching process is applied to the metal layer in order to form a gate electrode 124, a gate pad 129, a gate line 121, a first storage electrode 133a, a second storage electrode 133b and a storage line 131.

Figure 7:
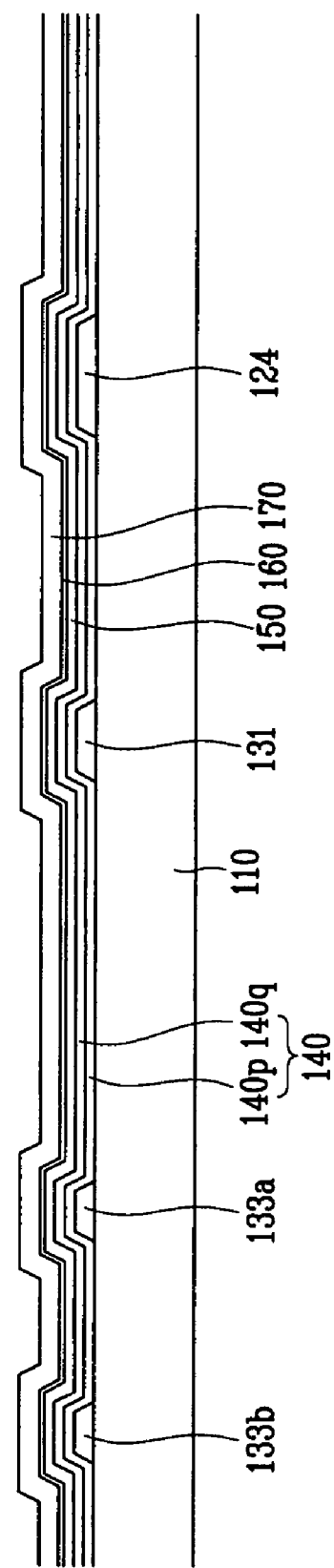
FIGS. 7, 9, 11, 13 and 15 are cross-sectional views illustrating a forming process over a gate line and a storage line of FIG. 5.
Figure 8:
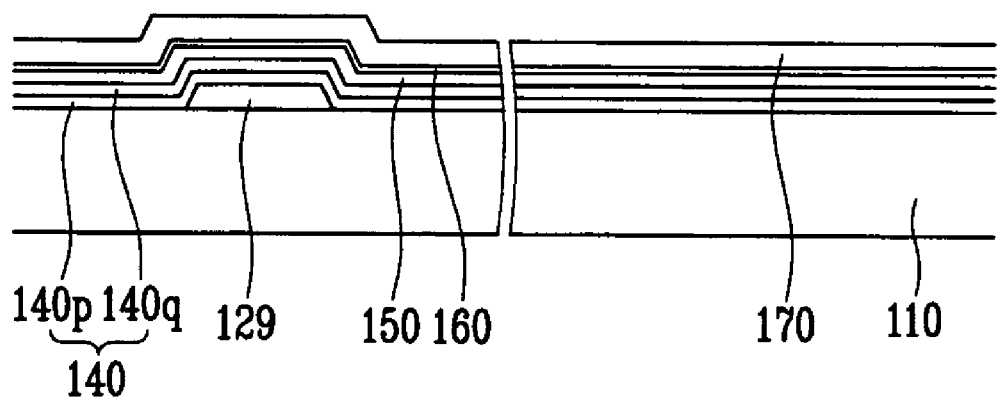
FIGS. 8, 10, 12, 14 and 16 are cross-sectional views illustrating a forming process over a data line of FIG. 6.

As shown in FIG. 7 and FIG. 8, a gate insulator 140 is formed over the gate line 121, the storage line 131 and the lower substrate 110.

The gate insulator 140 is made of silicon nitride or silicon oxide, and includes a lower gate insulator 140p and an upper gate insulator 140q which are sequentially formed over the lower substrate 110.

The thickness of the lower gate insulator 140p is about 4,000Å and the thickness of the upper gate insulator is about 500Å.

After depositing the gate insulator, a plasma enhanced chemical vapor deposition PECVD method is applied to form an intrinsic amorphous silicon a-Si layer 150, in which the intrinsic amorphous silicon a-Si layer 150 includes two layers, intrinsic amorphous silicon a-Si layer 150 and extrinsic amorphous silicon a-Si layer 160.

The intrinsic amorphous silicon a-Si layer 150 is made of hydrogenated amorphous silicon, and the extrinsic amorphous silicon n+a-Si layer 160 is made of amorphous silicon or silicide highly doped with n-type impurities such as phosphorus P.

Then, a data layer 170 is formed of molybdenum over the extrinsic amorphous silicon n+a-Si layer 160.

Figure 9:
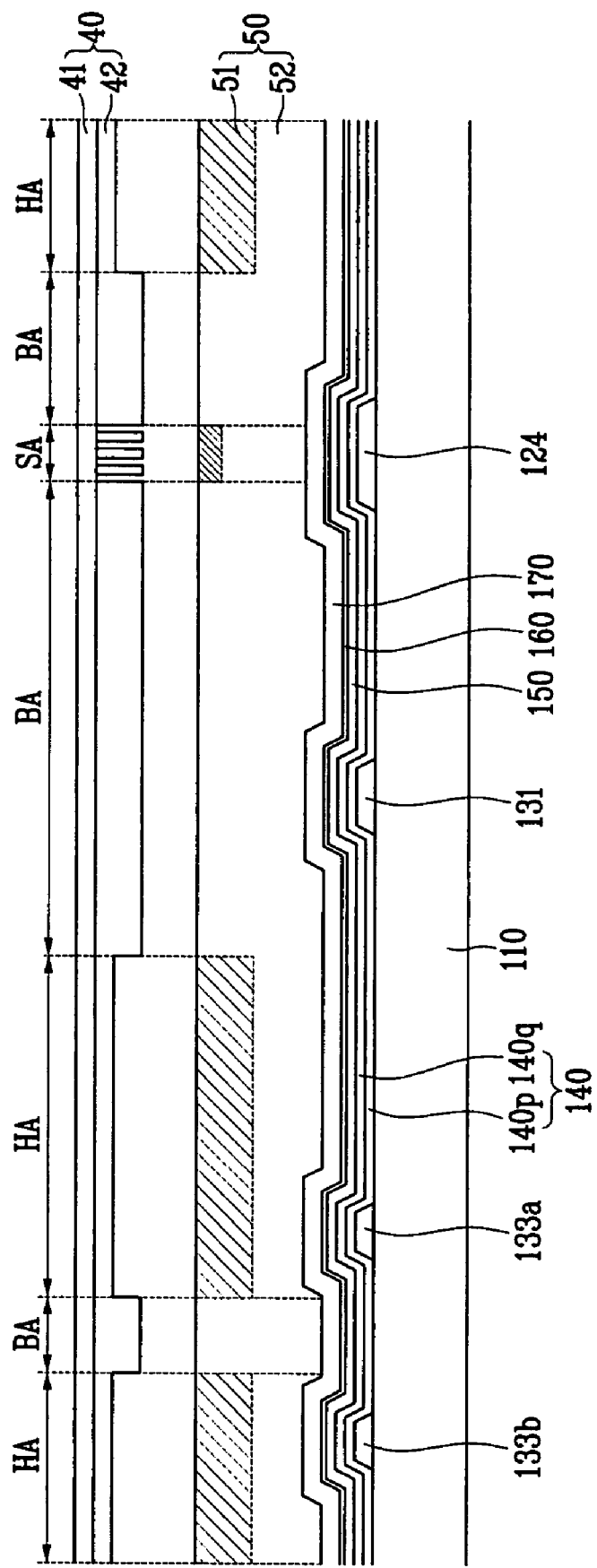
Figure 10:
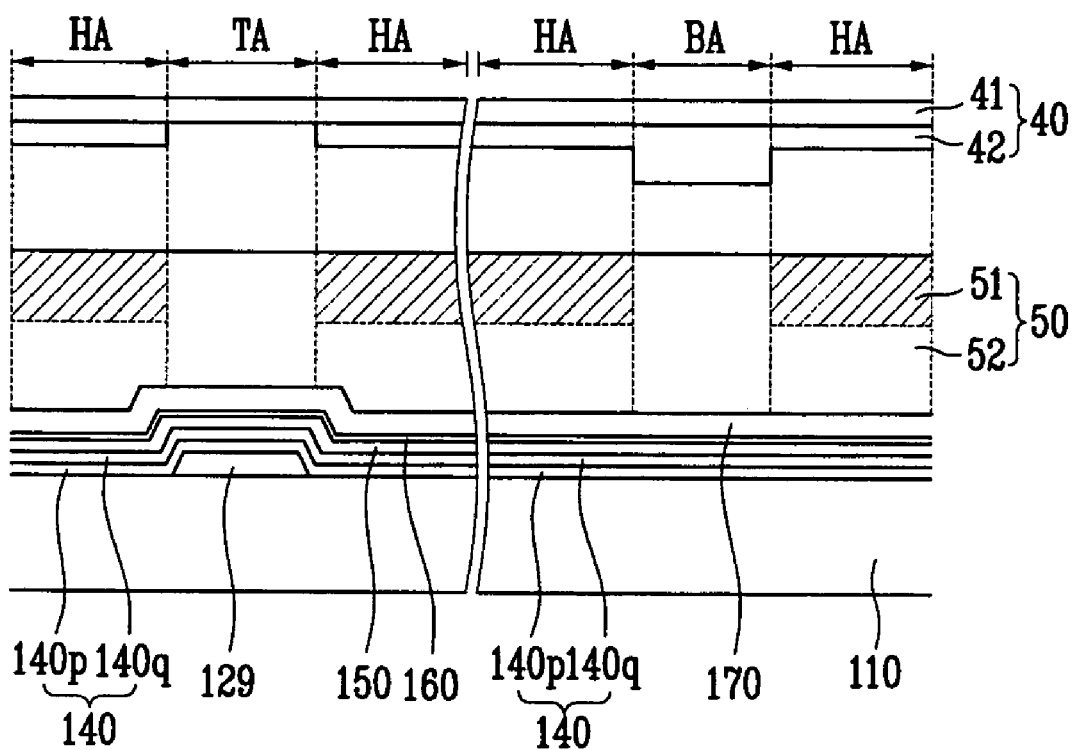

As shown in FIG. 9 and FIG. 10, a photosensitive layer 50 is formed over the data layer 170, and then a photo mask 40 is arranged over the photosensitive layer 50.

The photo mask 40 includes a light protection layer 42 on a transparent substrate 41, the light blocking layer being divided into a light blocking region BA, a full light transmission region TA, a half light transmission region HA and a slit region SA.

The light protection layer 42 is formed in the light protection region BA to block all lights, and provides partial light transmission region HA. The light protection layer 42, however, is not formed in the light transmission region TA, thus there is full light transmission, and is formed with slits in region SA, the slits being arranged in the form of projections or columns having a certain width in the slit region SA.

The light protection layer 42 of the half transmission region HA is thinner than the light protection region BA, and therefore the quantity of light passing the half light transmission region HA is less than the slit area SA, but more than in the light transmission region TA. The light protection layer 42 may be made of metal, such as chrome (Cr).

After irradiating and developing the photo sensitive film 50 through the photo mask 40, the photo sensitive film 50 exposed to light more than a reference amount is developed or removed. Reference character 51 indicates the portion of the photosensitive film which is removed.

Specifically, the portions of the photosensitive film 50 beneath light protection regions BA are fully protected and remain full thickness, but the portion of photosensitive film beneath the light transmission region TA is fully developed and is removed.

The photosensitive film 50 beneath the half transmission region HA is about 50% developed and accordingly 50% removed. The photosensitive film 50 beneath the slit region SA is developed to a lesser thickness than the half transmission region HA because of the difference in light exposure.

In FIGS. 9 and 10, after developing process, the cross hatched areas 51 of the photosensitive film 50 are removed leaving photosensitive film in the non-cross hatched areas indicated by reference character 52. The foregoing process creates a first photosensitive film pattern.

Figure 11:
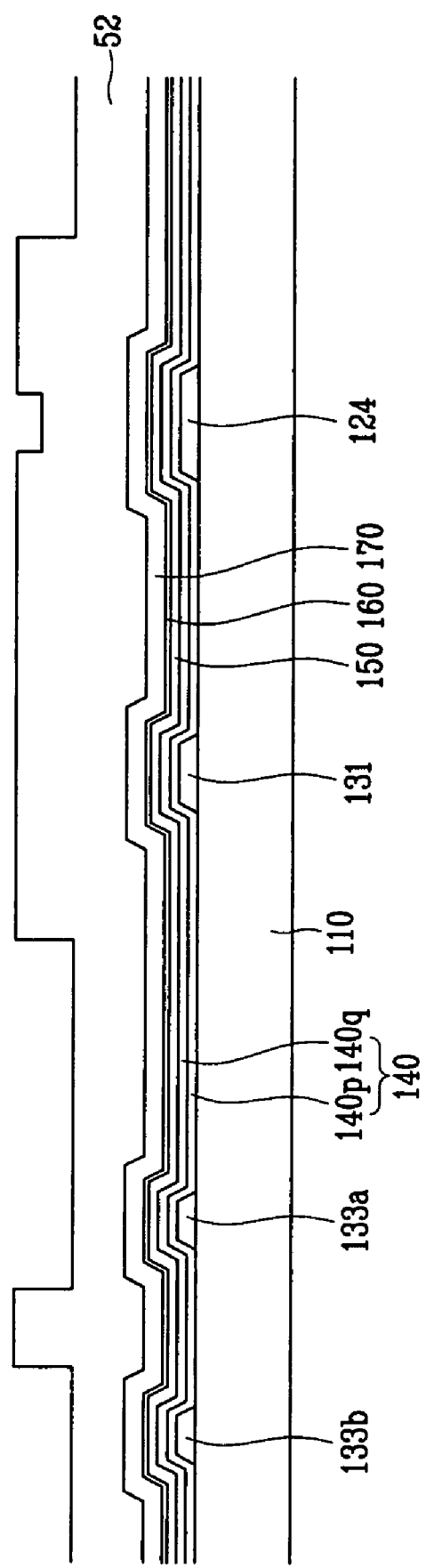
Figure 12:
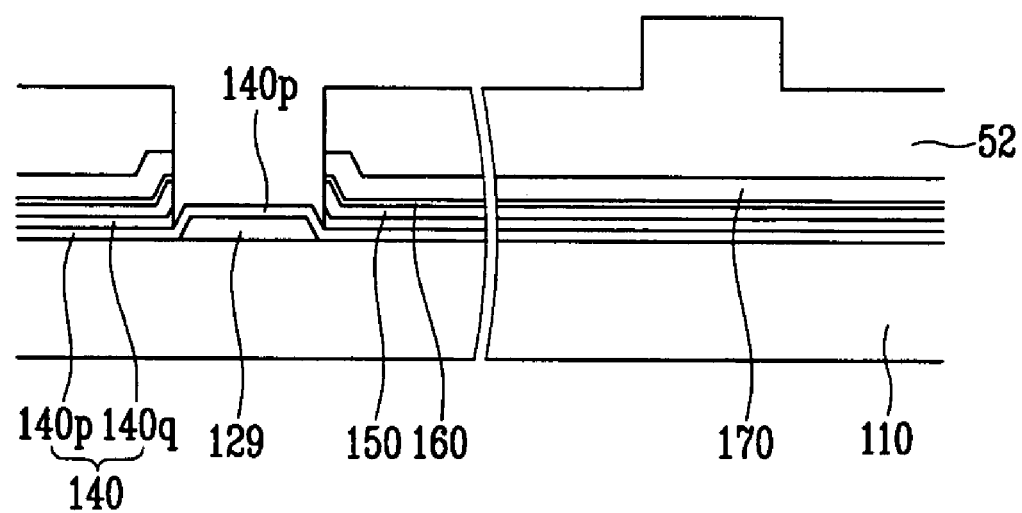

After above process, as shown in FIG. 11 and FIG. 12, the data layer 170 is etched using photo sensitive film 52 as a mask, and then the other layers, such as the extrinsic amorphous silicon 160, the intrinsic amorphous silicon layer 150 and the gate insulator film 140, are consecutively etched. The lower film 140p of the gate insulator 140 is not etched at the gate pad 129 of the gate line which has the thickness of about 500Å or 800Å.

Figure 13:
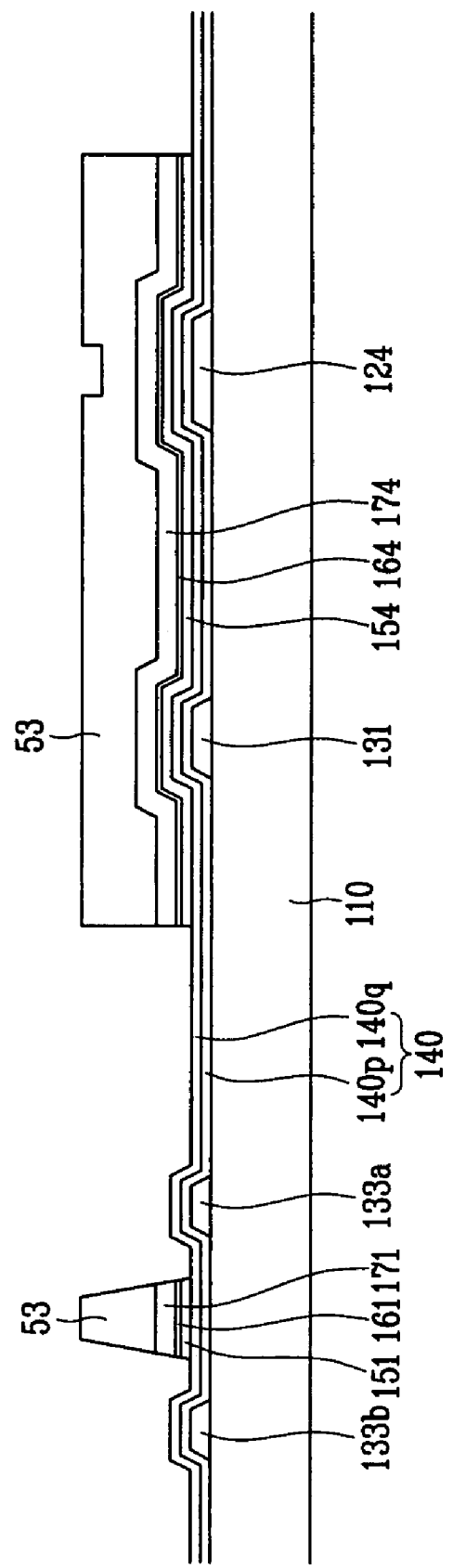
Figure 14:
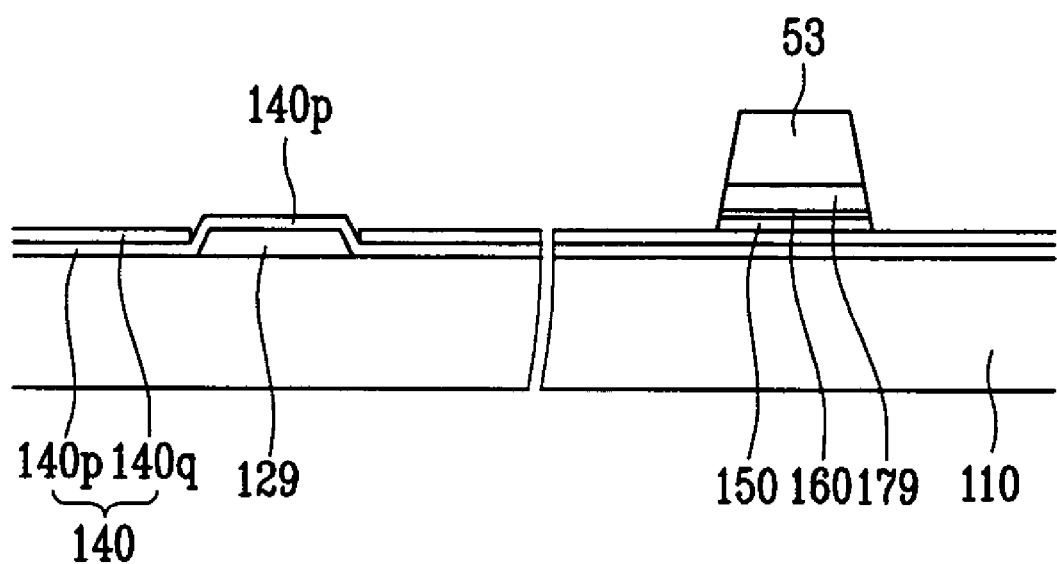

As shown in FIG. 13 and FIG. 14, portions of photo sensitive film 52 have been removed, and the data layer 170 is revealed. More particularly, the portions of photo sensitive film 52 which were beneath the half light transmission region HA have been fully removed. However, the remaining portions of photo sensitive film 53 which were beneath the light protection region BA and slit region SA remain. This process results in the production of a second photosensitive film pattern.

The process of removing portions of the photosensitive film to create the second photosensitive film pattern is known as ashing.

With the use of the photo sensitive film 53 as a function of a mask, the data layer 170, the extrinsic amorphous silicon layer 160 and the intrinsic amorphous silicon layer 150 are removed by etching so that a source-drain pattern 174, a data pad 179 of the data line 171 and a protrusion 154 of the semiconductor layer 151 are formed.

The source-drain pattern 174 is a conductive pattern in which a source electrode is coupled to a drain electrode. A portion of part of the gate insulator 140 is removed, leaving lower film 140p of the gate insulator 140 over the gate pad 129 at the edge of the gate line 121 with a thickness of less than about 200Å.

Figure 15:
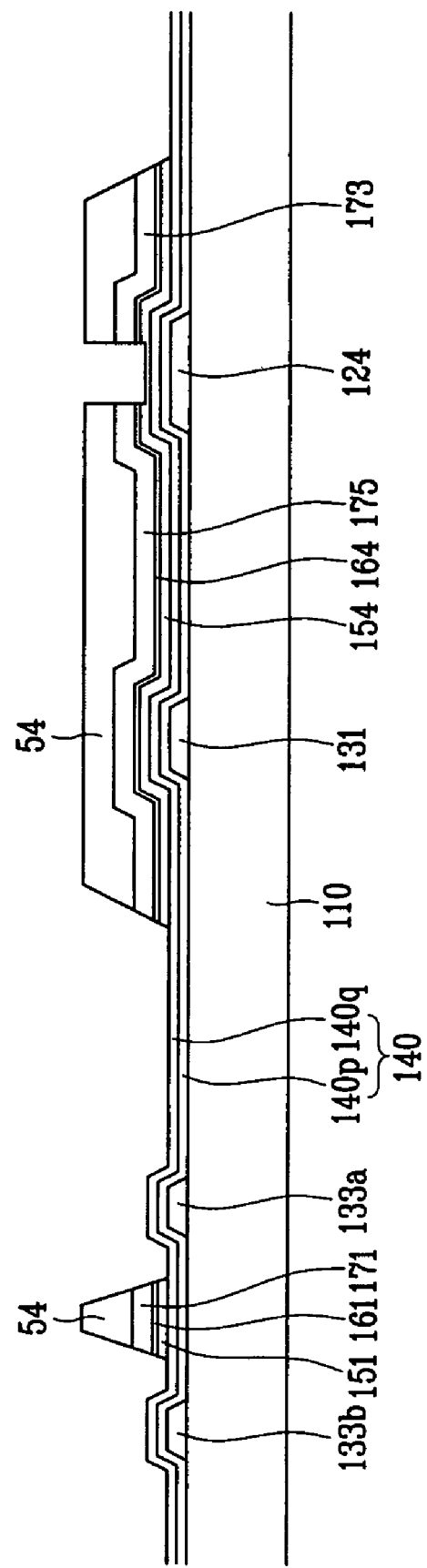

Then, as shown in FIG. 15 and FIG. 16, the photo sensitive film 53 is ashed; the source drain pattern 174 is exposed. The photo sensitive film 53 which was beneath the slit region SA is fully removed and the regions of the photo sensitive film 54 indicated by reference character which were beneath the light protection regions BA remain. The photo sensitive film 54 has a thickness which is equal to the thickness of the photoresist removed in the area which was beneath slit region SA.

With the photo sensitive film 54 as a function of a mask, a protrusion area 154 of the semiconductor layer 151 is exposed by sequentially etching the source-drain pattern 174 and the doped amorphous silicon pattern 164.

As the source-drain pattern 174 is patterned, as shown in FIG. 17 to FIG. 19, a source electrode 173 and a drain electrode 175 are formed.

The extrinsic amorphous silicon pattern 164 is achieved by an over etching process. In the process, the gate insulator 140 is removed by a certain amount of thickness, and includes a contact hole 141 which is formed by fully removing the lower film 140p of the gate insulator 140 over the gate pad 129. The photo sensitive film 54 is removed.

As shown in FIG. 20 to FIG. 22, the passivation layer 180 is formed over the gate insulator 140, a gate pad 129, a data line 171, and a drain electrode 175. The passivation layer 180 is generally formed of non-organic material such as silicon nitride SiNx or oxidation silicon SiOx.

The passivation layer 180 includes an upper and lower passivation layer, in which the upper overcoating layer is formed of non-organic insulator and the lower passivation layer is formed of organic insulator. The organic insulator may be photosensitive and may have a dielectric constant preferably about 4.0 or less.

By etching the passivation layer 180, contact holes 181, 182, 183a, 183b, 185 are formed, in which a contact hole 181 is for exposing a gate pad 129. a contact hole 182 for a data pad, a contact hole 183a for one end of the first storage electrode 133a, a contact hole 183b for the other end of the first storage electrode 133a and a contact hole 185 for a drain electrode 175.

Following to above process, exposing time for etching is almost evenly applied to the gate pad 129, data pad 179 and storage electrodes 133a, 133b of the storage line 131 via contact holes 181, 182, 183a, 183b and 185.

As a result, while forming the contact holes 181, 182, 183a, 183b, 185 by etching process, damage to gate pad 129, data pad 179 and drain electrode 175 is prevented, and an inversed tapered structure is prevented from being formed.

As shown in FIG. 1 to FIG. 3, over the contact holes 181, 182, 183a, 183b, 185 and passivation layer 180, a transparent electrode ITO or IZO are deposited by sputtering process; a plurality of pixel electrodes 191, a connection leg 83 and contact members 81, 82 are formed using a photolithograph process by photo process.

Although the invention has been described with reference to preferred embodiments thereof, it will be understood that variations and modifications can be effected within the spirit and scope of the invention as described above and as defined in the appended claims.

What is claimed is:

1. A manufacturing method of liquid crystal display comprising:
    forming a gate line on an insulating substrate;
    forming a gate insulating layer on the gate line;
    sequentially forming a semiconductor layer, and a data layer on the gate insulating layer;
    forming a photosensitive film to a thickness on the data layer;
    forming a first photosensitive film pattern by exposing the photosensitive film to light using a mask to selectively develop predetermined portions of the photosensitive film, the mask being configured such that a plurality of regions are defined in the photosensitive film with certain ones of the plurality of regions having developed and undeveloped thickness, wherein in a first region the photosensitive film has a first undeveloped thickness, in a second region the photosensitive film has a second undeveloped thickness, in a third region the photosensitive film has a third undeveloped thickness which is less than the second undeveloped thickness, and in a fourth region the photosensitive film is developed to a thickness equal to the thickness of the photosensitive film;
    removing the developed portions of the photosensitive film;
    etching the data layer, the semiconductor layer, and the gate insulating layer under the fourth region using the first photosensitive pattern as a mask;
    forming a second photosensitive pattern by removing the first photosensitive film pattern to thereby expose the data layer under the third region;
    forming a semiconductor pattern and a data line including a preliminary source drain pattern and an end part by etching the data layer and the semiconductor layer using the second photosensitive film pattern as a mask;
    forming a third photosensitive film pattern by ashing the second photosensitive film pattern to thereby expose the preliminary source drain pattern under the second region;
    forming source and drain electrodes by etching the exposed preliminary source drain pattern using the third photosensitive film pattern as a mask; and
    removing the third photosensitive film pattern,
    wherein the gate insulating layer having at least two layers is partially removed during the etching process of the data layer, and is completely removed during the forming process of the source and drain electrodes.

2. The manufacturing method of claim 1, wherein the mask has a light blocking region, a slit region, a light transmission region, and a transflective region.

3. The manufacturing method of claim 2, wherein when the photosensitive film is exposed and developed, the mask is disposed such that the light blocking region, the slit region, the transflective region, and the light transmission region correspond to the first region, the second region, the third region, and the fourth region, respectively.

4. The manufacturing method of claim 1, further comprising forming a passivation layer on the data line and the drain electrode; and
    forming a first contact hole for exposing the drain electrode by etching the passivation layer.

5. The manufacturing method of claim 4, wherein the gate line comprises at an end part, and in the forming of the first contact hole, a second contact hole for exposing the end part of the gate line is formed.

6. The manufacturing method of claim 4, wherein the first and second contact holes have a normal taper structure in which cross-sectional areas thereof become gradually wider toward upper parts thereof.

7. The manufacturing method of claim 5, wherein the first and second contact holes have a normal taper structure in which cross-sectional areas.

8. The manufacturing method of claim 1, wherein the gate insulating layer is formed in a thickness of about 4,500 Å.

9. The manufacturing method of claim 8, wherein, after the etching of the data layer, the semiconductor layer, and the gate insulating layer under the fourth region using the first photosensitive film pattern as a mask, the gate insulating layer on the end part of the gate line corresponding to the fourth region has a thickness of 500 Å to 800 Å.

10. The manufacturing method of claim 9, wherein, after the forming of a semiconductor pattern and a data pattern by etching the data layer and the semiconductor layer suing the second photosensitive film pattern as a mask, the gate insulating layer on the end part of the gate line has a thickness of less than 200 Å.

* * * * *